(12) United States Patent  
Standiford et al.

(10) Patent No.: US 9,715,995 B1  
(45) Date of Patent: Jul. 25, 2017

(54) APPARATUS AND METHODS FOR ELECTRON BEAM LITHOGRAPHY USING ARRAY CATHODE

(71) Applicant: KLA-Tencor Corporation, Milpitas, CA (US)

(72) Inventors: Keith Standiford, Carmel, CA (US); Alan D. Brodie, Palo Alto, CA (US); Paul F. Petric, Pleasanton, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/542,105

(22) Filed: Nov. 14, 2014

Related U.S. Application Data

(62) Division of application No. 13/190,901, filed on Jul. 26, 2011, now abandoned.

(60) Provisional application No. 61/369,621, filed on Jul. 30, 2010.

(51) Int. Cl.
*H01J 37/14* (2006.01)
*H01J 37/317* (2006.01)

(52) U.S. Cl.
CPC .......... *H01J 37/3177* (2013.01); *H01J 37/14* (2013.01); *H01J 2237/31766* (2013.01); *H01J 2237/31774* (2013.01); *H01J 2237/31781* (2013.01)

(58) Field of Classification Search
CPC .......... H01J 37/3174; H01J 2237/0435; H01J 2237/31774; H01J 37/3026; H01J 2237/31761; H01J 37/3175; H01J 2237/31723; H01J 2237/31777; H01J 2237/31788; H01J 2237/31781; G03F 7/2059; G03F 7/70383
See application file for complete search history.

(56) References Cited

U.S. PATENT DOCUMENTS

| | | | |
|---|---|---|---|
| 4,974,736 A | 12/1990 | Okunuki et al. | |
| 5,103,101 A * | 4/1992 | Berglund | B82Y 10/00 250/398 |
| 5,124,664 A | 6/1992 | Cade et al. | |
| 5,260,579 A * | 11/1993 | Yasuda | B82Y 10/00 250/398 |

(Continued)

FOREIGN PATENT DOCUMENTS

WO    WO 98/34266    8/1998

*Primary Examiner* — Brook Purinton
(74) *Attorney, Agent, or Firm* — Okamoto & Benedicto LLP

(57) ABSTRACT

One embodiment relates to an apparatus for electron beam lithography. The apparatus includes an array of cold cathode electron sources for generating an array of electron beams, and driver circuitry underlying the array of electron sources. The driver circuitry is configured to selectively blank individual electron beams so as to create a patterned array of electron beams. The apparatus further includes an imaging system configured to focus and demagnify the patterned array of electron beams and a movable stage for holding a target substrate. The movable stage is configured to translate the target substrate under the patterned array of electron beams. A computer may be configured to send drive signals to the driver circuitry to cause a pattern to be written onto the target substrate to roll across the array in synchronization with the translation of the target substrate. Other embodiments, aspects and feature are also disclosed.

18 Claims, 7 Drawing Sheets

1 pass 2 pass 4 pass

(56) References Cited

U.S. PATENT DOCUMENTS

| | | |
|---|---|---|
| 5,514,847 A | 5/1996 | Makishima et al. |
| 5,796,211 A | 8/1998 | Graebner et al. |
| 5,814,926 A | 9/1998 | Tomihari |
| 5,986,626 A | 11/1999 | Tanaka |
| 6,377,002 B1* | 4/2002 | Ge .......................... H01J 9/148 |
| | | 313/422 |
| 6,629,869 B1 | 10/2003 | Xie et al. |
| 7,696,498 B2 | 4/2010 | Carroll |
| 7,755,061 B2 | 7/2010 | Grella et al. |
| 2004/0121246 A1* | 6/2004 | Brown ................ G03F 7/70475 |
| | | 430/5 |
| 2004/0127012 A1 | 7/2004 | Jin |
| 2005/0053850 A1* | 3/2005 | Askebjer ............ G03F 7/70558 |
| | | 430/5 |
| 2005/0242302 A1 | 11/2005 | Platzgummer et al. |
| 2005/0264148 A1 | 12/2005 | Maldonado et al. |
| 2007/0029506 A1 | 2/2007 | Zywno et al. |
| 2009/0114837 A1 | 5/2009 | Grella et al. |

\* cited by examiner

FIG. 1     100

APPARATUS AND METHODS FOR ELECTRON BEAM LITHOGRAPHY USING ARRAY CATHODE

CROSS-REFERENCE TO RELATED APPLICATION(S)

The present application is a divisional of pending U.S. patent application Ser. No. 13/190,901, filed Jul. 26, 2011 by inventors Keith Standiford, Alan Brodie and Paul Petric, the disclosure of which is hereby incorporated by reference. U.S. patent application Ser. No. 13/190,901 claims the benefit of provisional U.S. Patent Application No. 61/369,621, filed Jul. 30, 2010 by inventors Keith Standiford, Alan Brodie and Paul Petric, the disclosure of which is hereby incorporated by reference.

STATEMENT REGARDING FEDERALLY SPONSORED RESEARCH OR DEVELOPMENT

This invention was made with Government support under Agreement No. HR0011-07-9-0007 awarded by DARPA. The Government has certain rights in the invention.

BACKGROUND

Technical Field

The present invention relates to electron beam lithography.

Description of the Background Art

A lithographic process includes the patterned exposure of a resist so that portions of the resist can be selectively removed to expose underlying areas for selective processing such as by etching, material deposition, implantation and the like. Traditional lithographic processes utilize electromagnetic energy in the form of ultraviolet light for selective exposure of the resist.

As an alternative to electromagnetic energy (including x-rays), charged particle beams have been used for high resolution lithographic resist exposure. In particular, electron beams have been used since the low mass of electrons allows relatively accurate control of an electron beam at relatively low power and relatively high speed.

SUMMARY

One embodiment relates to an apparatus for electron beam lithography. The apparatus includes an array of cold cathode electron sources for generating an array of electron beams, and driver circuitry underlying the array of electron sources. The driver circuitry is configured to selectively blank individual electron beams so as to create a patterned array of electron beams. The apparatus further includes an imaging system configured to focus and demagnify the patterned array of electron beams and a movable stage for holding a target substrate. The movable stage is configured to translate the target substrate under the patterned array of electron beams. A computer may be configured to send drive signals to the driver circuitry to cause a pattern to be written onto the target substrate to roll across the array in synchronization with the translation of the target substrate.

Other embodiments, aspects and feature are also disclosed.

DETAILED DESCRIPTION

Figure 1:
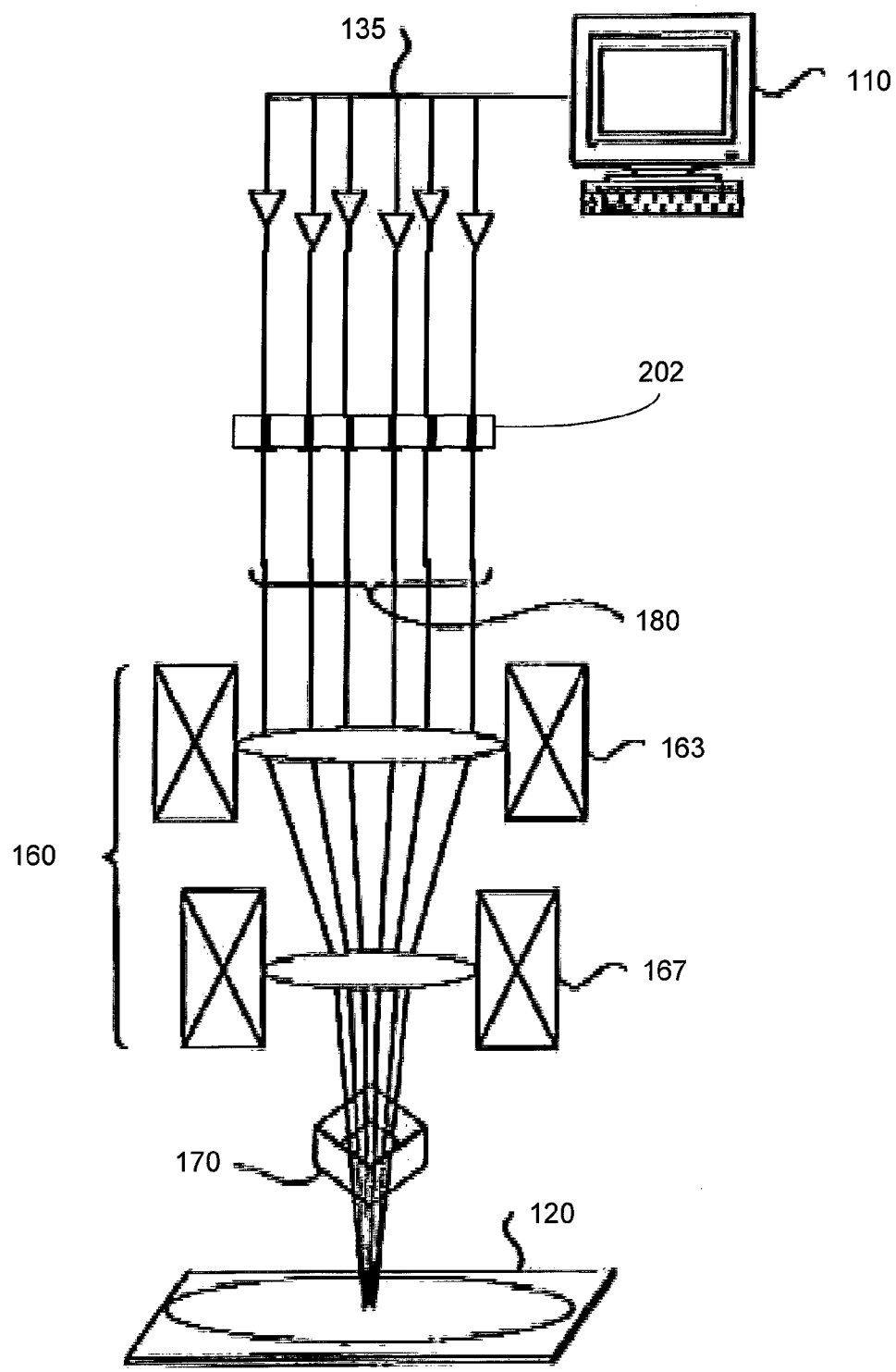
FIG. 1 shows as an overall structure for the electron beam lithography apparatus in accordance with an embodiment of the invention.

FIG. 1 shows as an overall structure for the electron beam lithography apparatus 100 in accordance with an embodiment of the invention. An array 202 of electron sources may be imaged onto a semiconductor wafer 120. The apparatus includes a vacuum chamber such that the electron beams travel from the sources to the target wafer in a vacuum environment.

The array of electron sources 202 may be a two-dimensional array of cold cathode electron sources operating at or near room temperature. The cold cathode electron sources may comprise ballistic electron emitters or field emitters. An array of electron beams 180 may be emitted from the array of electron sources 202.

The electron sources may be individually blanked using driver circuitry 135 which may be fabricated in the semiconductor substrate underlying the sources. The driver circuitry 135 may use, for example, static random access memory (SRAM) cells and shift registers, as described further below in relation to FIG. 6. A computer system 110 may be used to send electrical signals to control the driver circuitry 135.

The imaging of the electron sources 202 onto the semiconductor wafer 120 may be performed using a lens system 160 which may include one or more lens elements. For example, as depicted, the lens system 160 may include a first magnetic lens 163 which may be configured as a telecentric lens and a second magnetic lens 167 which may be configured as a correction lens.

A set of electrostatic deflection plates 170 may be configured for deflection of the focused array of electron beams. The deflection may be, for example, nanometer scale deflection which may be used for the purpose of the filling-in of write pixels on the surface of the target wafer 120.

Figure 2:
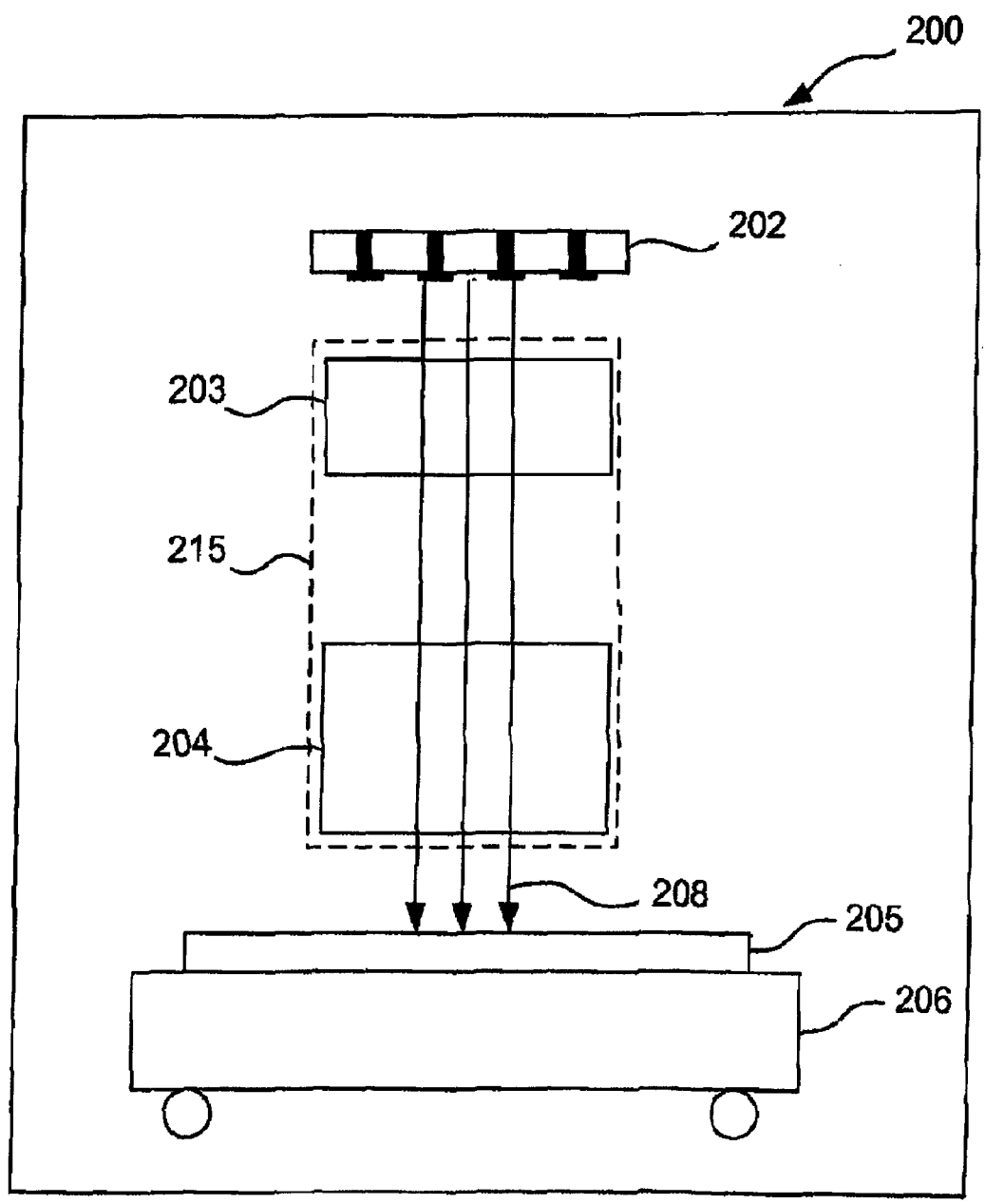
FIG. 2 shows as an overall structure for the electron beam lithography apparatus in accordance with another embodiment of the invention.

FIG. 2 shows as an overall structure for the electron beam lithography apparatus 200 in accordance with another embodiment of the invention. An array 202 of electron sources may be imaged onto a target substrate 205 to be patterned. The apparatus includes a vacuum chamber such that the electron beams travel from the sources to the target substrate 205 in a vacuum environment.

A stage 206 holds the target substrate 205. In one embodiment, the stage 206 may comprise a linear stage which is configured to move the target substrate 205 in a linear motion under the field of view of the lithography apparatus. In another embodiment, the stage 206 may comprise a rotary stage which is configured to move the target substrate 205 in a rotating motion under the field of view of the lithography apparatus.

The array of electron sources 202 may be a two-dimensional array of cold cathode electron sources operating at or near room temperature. The cold cathode electron sources may comprise ballistic electron emitters or field emitters.

The electron beams emitted from the electron sources may be individually blanked using driver circuitry which may be fabricated in the semiconductor substrate underlying the sources. The driver circuitry may use, for example, SRAM cells and shift registers, as described further below in relation to FIG. 6. A computer system may be used to send electrical signals to control the driver circuitry.

The imaging of the electron sources onto the target 205 may be performed using an imaging system 215 which may include one or more lens elements. For example, as depicted, the imaging system 215 may include an objective electron-optics system 203 and a projection electron-optics system 204. The imaging system 215 may focus and demagnify the pattern electron beam 208 onto the target 205.

The apparatus (100 and 200) described above in relation to FIGS. 1 and 2 do not need a magnetic prism and so avoid aberrations introduced by the prism. In contrast, Grella et al. (U.S. Pat. No. 7,755,061) uses a magnetic prism or beam separator that may introduce such aberrations. Furthermore, the apparatus (100 and 200) described above provides a shorter electron-optical path length compared to Grella et al. The shorter path length decreases electron interactions.

Moreover, in Grella et al., the voltage on an electron mirror is a large factor of the energy spread in the illuminating beam in order to generate sufficient image contrast at the wafer. However, as pixel sizes for the mirror array shrink, the voltage switching capability of the transistors under the mirror is decreased, which leads to a scaling problem. This scaling problem may be avoided by controlling the emitters directly as per the apparatus (100 and 200) described above. This is because controlling the emitters directly avoids the dependence on the energy spread of the illumination beam.

The apparatus (100 and 200) described above in relation to FIGS. 1 and 2 use closed-packed cold cathode electron sources with relatively large pixels in comparison to the pixel pitch. In contrast, Baylor et al. (International Publication No. WO 98/34266) uses small pixels (implemented as miniature-cathode field-emission sources) on a large pitch. Applicants believe that, using the Baylor et al. apparatus, it would be difficult to configure the imaging optics get a sufficient number of beams into a reasonable field size. In addition, the miniature-cathode field-emission sources are difficult to fabricate with sufficient uniformity and reliability.

The cold cathode electron sources in the apparatus (100 and 200) described above also contrasts with the photocathode sources used in Carroll (U.S. Pat. No. 7,696,498). Applicants believe that if the electron source pads were photocathodes as used in Carroll, then there would likely be difficulty getting sufficient light (photons) to reach a source pad due to it being at the bottom of the well-shaped structure. However, the cold cathode electron sources used in accordance with the present disclosure do not need light to be shined on them and so avoid this problem.

Applicants contemplate that various cold cathode electron sources may be utilized in the apparatus (100 or 200). Ballistic electron emitters are one class of cold cathode electron sources. The ballistic electron emitter may use a diamond or diamond-like coating. The coating may be hydrogen passivated to achieve negative electron affinity. The emitter may also incorporate resonant tunneling diodes in order to reduce the energy spread of the emitted beam. The cold cathode may also be based on field emission. Again, diamond or diamond-like coatings, with or without hydrogen passivation, may be utilized. Planar and tip-like structures are possible with such emitters.

Figure 3:
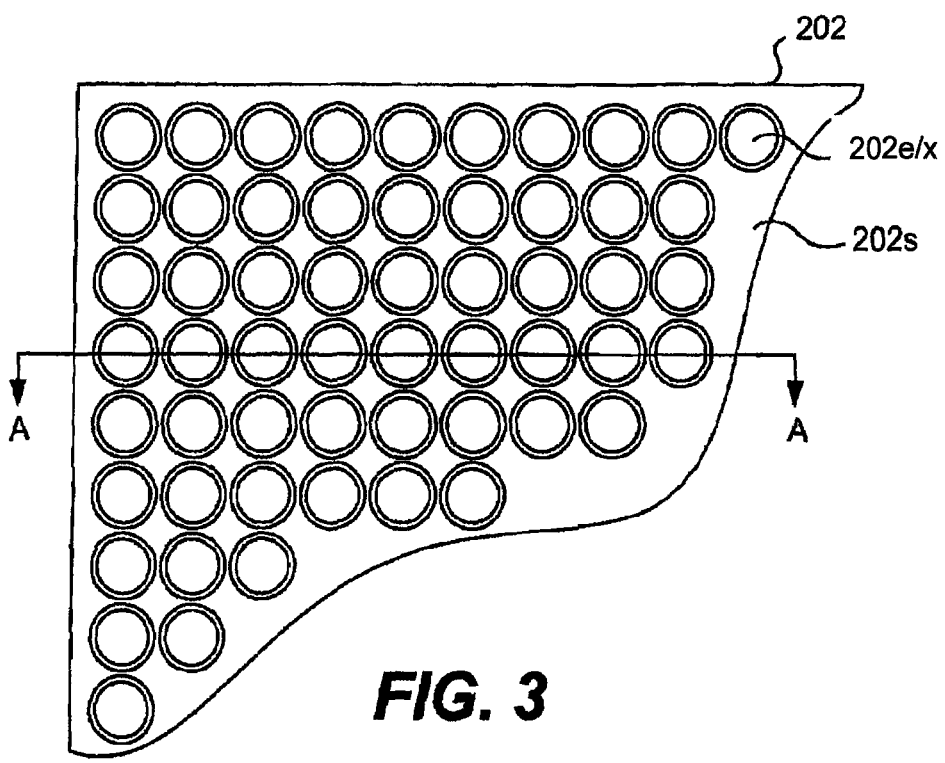
FIG. 3 shows an array of electron sources in accordance with an embodiment of the invention.

FIG. 3 shows an array of electron sources 202 in accordance with an embodiment of the invention. The individual sources 202$e/x$ in the array may be driven so as to either be emitting (e) or blanked (x) under the control of the driver circuitry. A conductive surface 202$s$ which does not function as an emissive source may surround the individual sources 202$e/x$.

Figure 4:
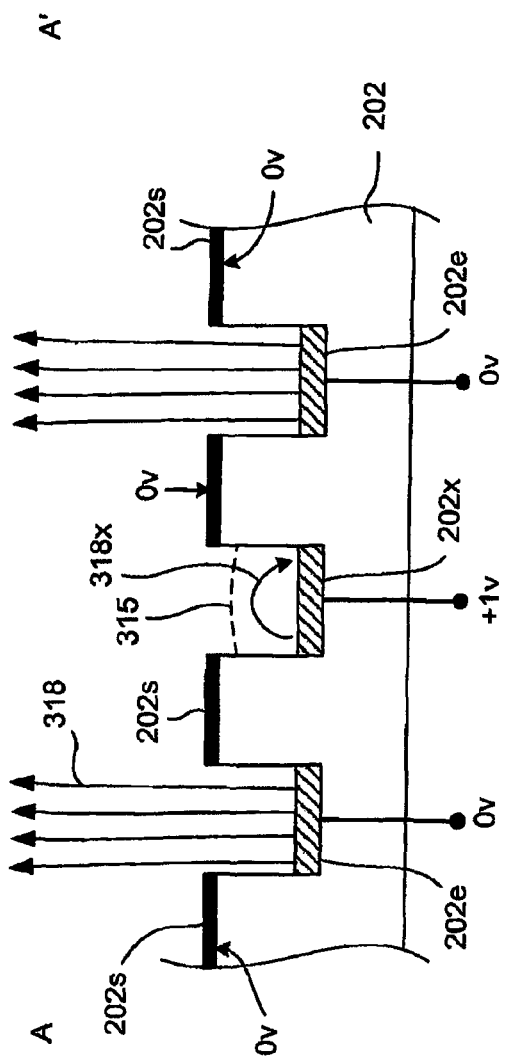
FIG. 4 is a cross-sectional view of a structure for the electron sources in accordance with an embodiment of the invention.

FIG. 4 is a cross-sectional view of a structure for the electron sources in accordance with an embodiment of the invention. The cross section shown is along the line A-A' in FIG. 3.

In the example shown, a voltage level of 0 volts is applied to the conductive surface 202$s$. A first voltage (in this example, also 0 volts) may be applied to drive individual sources 202$e$ to emit electrons 318, while a second voltage (in this example, +1 volt) may be applied to blank individual sources 202$x$ such that they do emit electrons. The blanking may occur because the electrons 318$x$ are either not produced or are reabsorbed by the "off" (blanked) contact 202$x$. In the illustrated example, the dashed line 315 represents an approximate 0.5 equipotential surface. Emitted electrons having a kinetic energy of less than 0.5 volts do not cross the surface 315 and thus do not become part of the electron flow. The specific voltage levels used will depend upon the particular implementation of the device.

Figure 5:
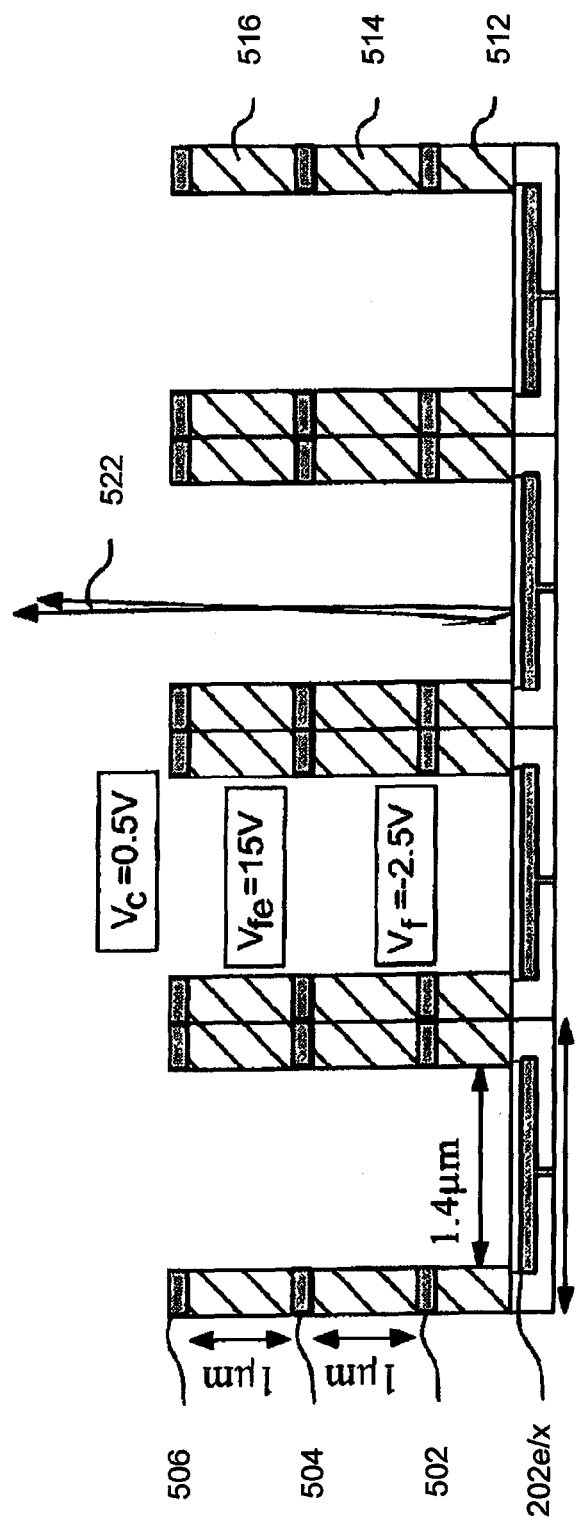
FIG. 5 is a cross-sectional view of a structure for the electron sources in accordance with another embodiment of the invention.

FIG. 5 is a cross-sectional view of a structure for the electron sources in accordance with another embodiment of the invention. In this embodiment, each individual electron source 202$e/x$ is configured at the bottom of a cup-shaped (well-shaped) structure which includes stacked electrode layers (502, 504, and 506). The insulative layers (512, 514 and 516) separate the conductive layers. As shown, the height of the sidewall of the well-shaped structure may be greater than a width of the electron source at the bottom of the well-shaped structure. The stacked-electrode well-shaped structure may be advantageously used to focus emitted electrons 522 so as to reduce or minimize electrons from one pixel influencing its neighbors.

Specific voltages may be applied to each of the stacked electrode layers (502, 504, and 506). In the illustrated example, $Vf=-2.5$ volts may be applied to the bottom electrode layer 502, $Vfe=15$ volts may be applied to the middle electrode layer 504, and $Vc=0.5$ volts may be applied to the top electrode layer 506. Of course, specific implementations may use different numbers and spacings of the stacked electrodes and/or different specific voltages to perform the same or similar functionalities. The dimensions of the electron sources 202 $e/x$ may also be varied.

In one embodiment, the configuration and voltages on the electrodes may be varied to construct the elements of an electron gun around each individual electron source 202 $e/x$. In addition, the electron sources 202 $e/x$ may be operated in a space charge limited mode so as to suppress Poisson noise.

Furthermore, the configuration and voltages on the electrodes may be set so that a "gun crossover" is formed for each source, and the imaging electron-optics may be configured to image the crossover onto the wafer surface. This may be used to create a spot size at the wafer that is smaller than the imaged pitch of the sources. In other words, the combination of electron emitters with the electrode structure allows the imaged spot size for each pixel to be varied independentl of the spacing between pixels in the image. This overcomes another scaling issue.

Applicants reiterate that if the electron source pads were photocathodes as used in Carroll, for example, then there would likely be difficulty getting sufficient light (photons) to reach a source pad due to it being at the bottom of the well-shaped structure. However, the cold cathode electron sources 202 e/x used in accordance with the present disclosure do not need light to be shined on them and so avoid this problem.

Figure 6:
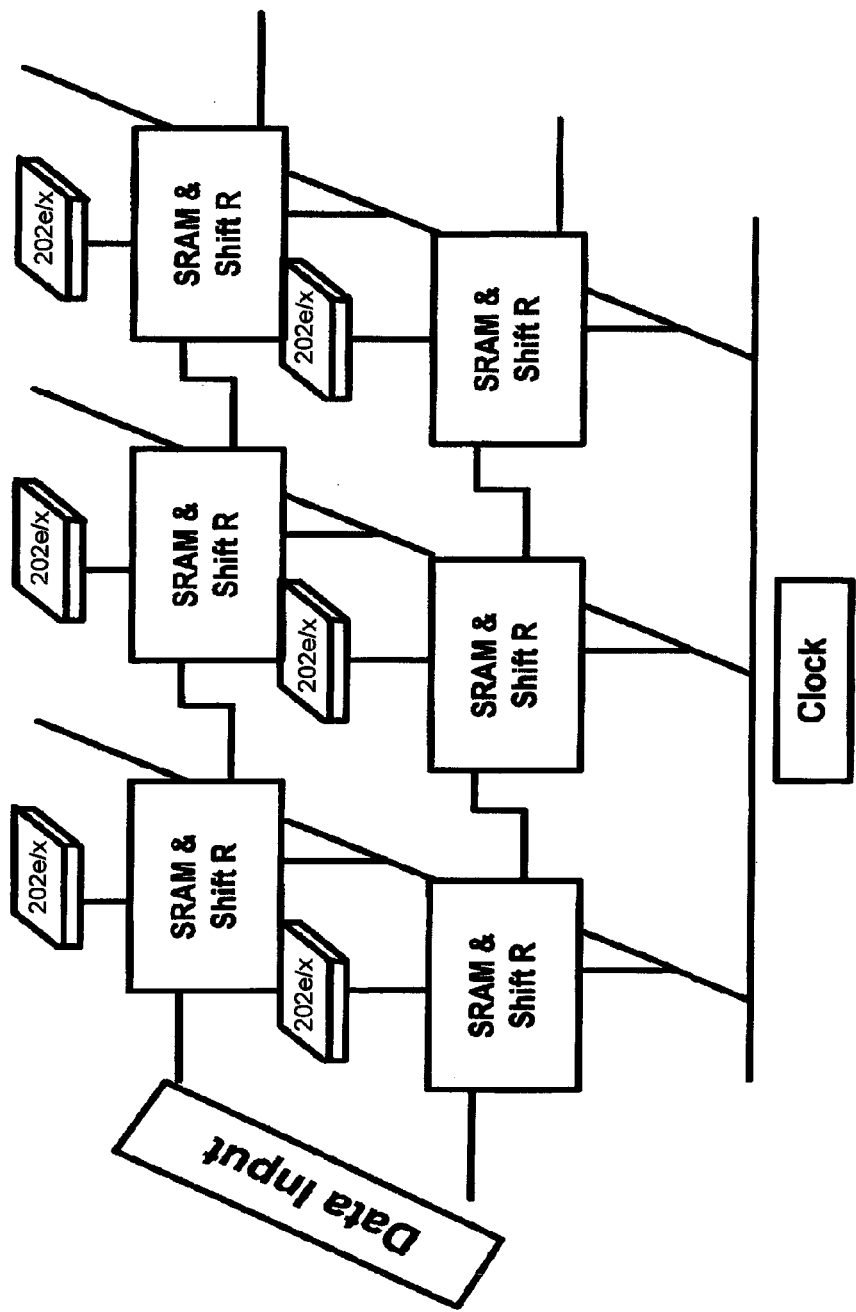
FIG. 6 is schematic diagram showing circuitry fabricated beneath the electron sources in accordance with an embodiment of the invention.

FIG. 6 is schematic diagram showing circuitry fabricated beneath the electron sources in accordance with an embodiment of the invention. As shown, the circuitry may resemble a static random access memory (SRAM) circuit.

The control signals (data input and clock) may be adjusted so that the desired pattern moves electronically across the electron-emitter array in a manner that is substantially similar to the way signals move through a shift register (Shift R) and at a rate so as to match a linear movement of the wafer. In this embodiment, each exposed point on the wafer may receive electrons from an entire column (or row) of electron sources. In other words, the operation of the apparatus may employ a "rolling image" method which may also be called a reverse time domain integration or reverse TDI method.

The use of a multitude of electron sources to expose each exposed point on the target leads to substantial advantages. First, since each point on the wafer to be exposed is exposed by effectively summing the output from multiple sources, individual variations between sources are averaged together such that the variations are effectively mitigated. This substantially reduces the requirements for uniformity in performance between the many sources.

Cold cathode electron sources have been traditionally difficult to fabricate in bulk with sufficiently repeatable and stable emission characteristics. The use of the reverse TDI writing strategy overcomes these traditional difficulties by allowing the averaging of many sources to achieve the final exposure.

In addition, the brightness of each source may be reduced in the reverse TDI method. Brightness may be considered as the available beam current at a given resolution or blur.

Cold cathode electron sources have been traditionally capable of relatively low brightness. The use of the reverse TDI writing strategy overcomes this traditional difficulty by allowing multiple sources to be effectively summed to achieve the final exposure.

It may be desired to operate the apparatus with a spot size image which is smaller than the spacing between pixels. The missing space may be filled using a variety of techniques. In one technique, a multi-pass writing strategy ay be employed, such as described below in relation to FIG. 7. Alternatively, multiple digital pattern generator (DPG) arrays may be arranged in the electron-optical field of view with the arrays offset from one another by a multiple of pixels plus a half pixel.

Figure 7:
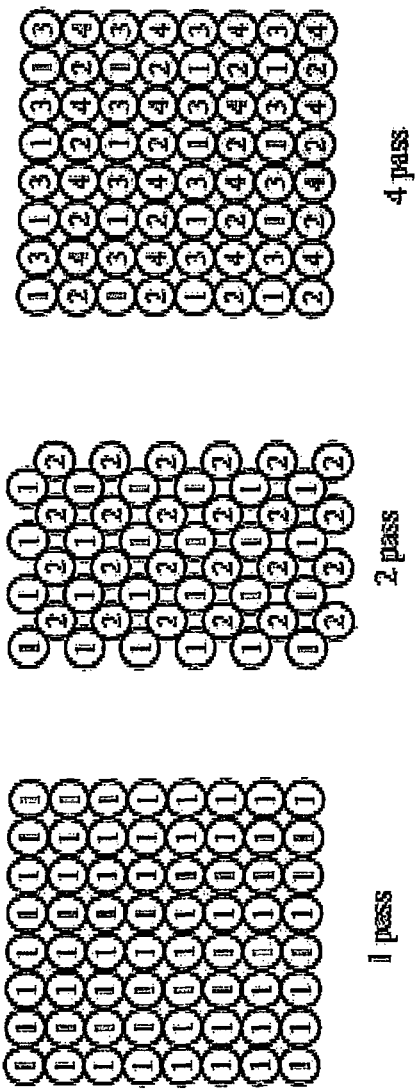
FIG. 7 shows single-pass and multi-pass pixel writing strategies in accordance with an embodiment of the invention.

FIG. 7 shows single-pass and multi-pass pixel writing strategies in accordance with an embodiment of the invention. In the single-pass pixel writing strategy ("1 pass"), the substrate is exposed a single time in a single pass under the electron-optical column. The pixel positions in the single pass are denoted "1".

Multi-pass writing strategies involve exposing the substrate twice or more in multiple "passes" under the electron-optical column. In each pass, the grid of pixels is offset from the previous grid by a fraction of a pixel, so as to create a composite grid which is finer than the grid of the individual passes.

In addition, in some implementations, each pass may be offset by roughly the height of each pass divided by the number of passes. This staggers the stitching boundary between passes so that any figures near the boundary will tend to have stitching errors averaged out. Overlay errors between passes will also be averaged.

In an exemplary two-pass pixel writing strategy ("2 pass"), the substrate is exposed two times in two passes under the electron-optical column. In each pass, the grid of pixels is offset from its previous position by a fraction of a pixel so as to create a composite grid which is finer than the grid of the individual passes. In the illustrated example, the pixel positions in the first pass are denoted "1", and the pixel positions in the second pass are denoted "2".

In an exemplary four-pass pixel writing strategy ("4 pass"), the substrate is exposed four times in four passes under the electron-optical column. In each pass, the grid of pixels is offset from its previous position by a fraction of a pixel so as to create a composite grid which is finer than the grid of the individual passes. In the illustrated example, the pixel positions in the first pass are denoted "1", the pixel positions in the second pass are denoted "2", the pixel positions in the third pass are denoted "3", and the pixel positions in the fourth pass are denoted "4".

The above disclosure provides innovative apparatus and methods for the generation and control of multiple electron beams. The apparatus and methods may be advantageous utilized for high-throughput electron beam lithography.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for electron beam lithography comprising:
    an electron beam column including an array of cold cathode electron sources for generating an array of electron beams;
    driver circuitry underlying the array of cold cathode electron sources, the driver circuitry being configured to selectively blank individual electron beams in the array of electron beams so as to create a patterned array of electron beams;

an imaging system configured to focus and demagnify the patterned array of electron beams; and a target substrate held on a movable stage, wherein the movable stage is configured to translate the target substrate under the patterned array of electron beams, wherein a pattern is written onto an area of the target substrate in first and second passes of the target substrate under the electron beam column, wherein a grid of pixels for the first pass is a rectangular grid that has a horizontal spacing between adjacent pixel positions in the horizontal direction and a vertical spacing between adjacent pixel positions in the vertical direction, and wherein a grid of pixels of the second pass is offset from the grid of pixels of the first pass by half the horizontal spacing in the horizontal direction and by half the vertical spacing in the vertical direction.

2. The apparatus of claim 1, further comprising:
a computer coupled to the driver circuitry, wherein drive signals sent by the computer to the driver circuitry causes pixels to be written onto the target substrate to roll across the array in synchronization with the translation of the target substrate.

3. The apparatus of claim 1, further comprising:
a sidewall surrounding each cold cathode electron source in the array.

4. The apparatus of claim 3, further comprising: a plurality of conductive layers in each sidewall; and a plurality of insulative layers in each sidewall, wherein the conductive and insulative layers alternate.

5. The apparatus of claim 3, wherein voltages are applied to the conductive layers in a sidewall of an electron source so as to create a crossover in an electron beam generated by the electron source.

6. The apparatus of claim 5, wherein the imaging system is configured to image the crossover onto a surface of the target substrate.

7. The apparatus of claim 1, wherein the cold cathode electron sources comprise ballistic electron emitters.

8. The apparatus of claim 7, wherein the ballistic electron emitters include a diamond coating.

9. A method of electron beam lithography, the method comprising:
generating an array of electron beams using an electron beam column with an array of cold cathode electron sources;
selectively blank individual electron beams in the array of electron beams using driver circuitry underlying the array of cold cathode sources so as to create a patterned array of electron beams;
focusing and demagnifying the patterned array of electron beams using an imaging system; and
performing multiple passes of translating a target substrate under the patterned array of electron beams using a movable stage holding the target substrate,
wherein a pattern is written onto an area the target substrate in first and second passes of the target substrate under the electron beam column,
wherein a grid of pixels for the first pass is a rectangular grid that has a horizontal spacing between adjacent pixel positions in the horizontal direction and a vertical spacing between adjacent pixel positions in the vertical direction, and wherein a grid of pixels of the second pass is offset from the grid of pixels of the first pass by half the horizontal spacing in the horizontal direction and by half the vertical spacing in the vertical direction.

10. The method of claim 9, further comprising:
sending drive signals by a computer to the driver circuitry to cause pixels to be written onto the target substrate to roll across the array in synchronization with the translation of the target substrate.

11. The method of claim 9, wherein each cold cathode electron source in the array is surrounded by a sidewall.

12. The method of claim 11, wherein the sidewall includes a plurality of conductive layers and a plurality of insulative layers in each sidewall, wherein the conductive and insulative layers alternate.

13. The method of claim 12, further comprising:
applying voltages to the conductive layers in a sidewall of an electron source so as to create a crossover in an electron beam generated by the electron source.

14. The method of claim 13, further comprising:
using the imaging system to image the crossover onto a surface of the target substrate.

15. The method of claim 9, wherein the cold cathode electron sources comprise ballistic electron emitters.

16. The method of claim 15, wherein the ballistic electron emitters include a diamond coating.

17. A system for electron beam lithography comprising:
an array of cold cathode electron sources for generating an array of electron beams;
driver circuitry underlying the array of cold cathode electron sources, the driver circuitry being configured to selectively blank individual electron beams in the array of electron beams so as to create a patterned array of electron beams;
an imaging system configured to focus and demagnify the patterned array of electron beams;
a target substrate held on a movable stage, wherein the movable stage is configured to translate the target substrate under the patterned array of electron beams; and
a computer coupled to the driver circuitry, wherein drive signals sent by the computer to the driver circuitry causes a pattern to be written onto the target substrate to roll across the array in synchronization with the translation of the target substrate,
wherein the pattern is written onto an area of the target substrate in first and second passes of the target substrate under the electron beam column,
wherein a grid of pixels for the first pass is a rectangular grid that has a horizontal spacing between adjacent pixel positions in the horizontal direction and a vertical spacing between adjacent pixel positions in the vertical direction, and
wherein a grid of pixels of the second pass is offset from the grid of pixels of the first pass by half the horizontal spacing in the horizontal direction and by half the vertical spacing in the vertical direction.

18. The system of claim 17, wherein voltages are applied to the conductive layers in a sidewall of an electron source so as to create a crossover in an electron beam generated by the electron source, and wherein the imaging system is used to image the crossover onto a surface of the target substrate.

* * * * *